Feb. 13, 1973 R. W. KETCHLEDGE 3,716,792
SELECTIVE OSCILLATOR MIXER FOR A SUPERHETERODYNE RECEIVER
Filed Aug. 11, 1971
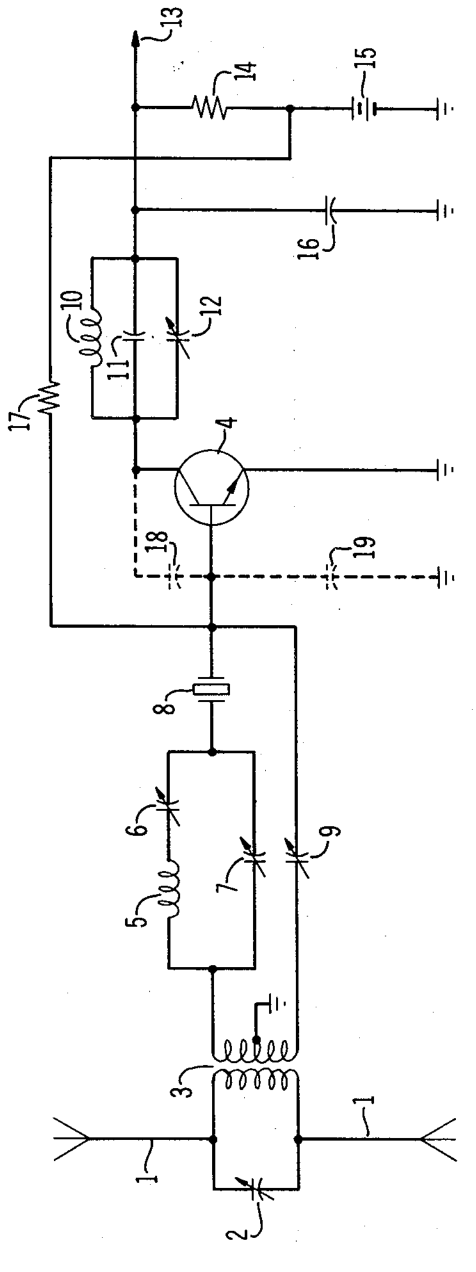

United States Patent Office 3,716,792
Patented Feb. 13, 1973

3,716,792

SELECTIVE OSCILLATOR MIXER FOR A SUPERHETERODYNE RECEIVER

Raymond Waibel Ketchledge, Wheaton, Ill., assignor to Bell Telephone Laboratories, Incorporated, Murray Hill, N.J.

Filed Aug. 11, 1971, Ser. No. 170,718
Int. Cl. H04b *1/26*
U.S. Cl. 325—438 9 Claims

ABSTRACT OF THE DISCLOSURE

A frequency selective oscillator mixer for a superheterodyne receiver takes the form of a radio frequency band selection filter and a transistor feedback oscillator in which a single piezoelectric crystal is connected in common both in the feedback path of the oscillator and in the filter and the oscillation frequency of the oscillator and the pass band of the filter are tuned to frequencies substantially equal to but slightly different from different harmonics of the crystal.

BACKGROUND OF THE INVENTION

This invention relates generally to mixer circuits for superheterodyne radio receivers and more particularly to oscillator mixer circuits which rely upon piezoelectric crystals to provide a high degree of frequency stability.

In a superheterodyne receiver, a mixer circuit is used as a first detector to shift incoming radio frequency signals to an intermediate frequency for amplification prior to final detection. An oscillator mixer circuit, sometimes known simply as a converter, is a mixer circuit which itself constitutes a local oscillator and is driven directly by the radio frequency signals to perform the frequency shifting or heterodyning function. When a receiver is required to accept only a single narrow band of radio frequency signals, it is common to employ a piezoelectric crystal to stabilize the operating frequency of the oscillator mixer over relatively wide ranges of ambient temperature and supply voltage variation.

A band selection filter is normally added to a superheterodyne receiver to couple the desired radio frequency signals to the oscillator mixer and to exclude other frequencies. For applications in which the receiver is required to accept only a single narrow band of radio frequencies, it is advantageous also to employ a piezoelectric crystal to control the pass band of the selection filter. Use of separate crystals for both the oscillator mixer and the band selection filter, however, tends to increase both the cost and the complexity of a receiver to an undesirable degree.

A principal object of the invention is, therefore, to reduce the cost and complexity of superheterodyne receivers by permitting the same piezoelectric crystal to be used in both the oscillator mixer and the band selection filter.

SUMMARY OF THE INVENTION

In accordance with the invention, a single piezoelectric crystal is employed to control both the oscillator mixer and the radio frequency band selection filter in a superheterodyne radio receiver by connecting the crystal in common in both the feedback path of the oscillator mixer and the band selection filter and tuning the oscillation frequency of the oscillator mixer and the pass band of the filter to frequencies substantially equal to but different from different harmonics of the crystal. As a result, the crystal is enabled to control both the oscillator mixer and the filter without significant harmonic interaction and the oscillator mixer and the selective filter can be fine tuned substantially independently of one another. The harmonic to which the oscillator mixer is substantially tuned may, by way of example, be the crystal fundamental and that to which the filter is substantially tuned a higher harmonic.

DESCRIPTION OF THE DRAWING

The single figure of the drawing is a schematic diagram of a single stage selective transistor oscillator mixer embodying the invention.

DETAILED DESCRIPTION

In the illustrated embodiment of the invention, the elements of the radio frequency selective filter and the oscillator mixer are combined in a particularly advantageous manner. As shown, a balanced dipole antenna 1 has its two halves connected by the parallel combination of a variable capacitor 2 and the primary winding of a radio frequency transformer 3. This parallel combination is arranged to resonate with antenna 1 at the frequency of the incoming radio frequency signals. The secondary winding of transformer 3 has its midpoint grounded and both ends connected through separate paths to the base electrode of an n-p-n transistor 4. The upper end of the secondary winding is connected to a parallel circuit, one arm of which consists of the series combination of an inductor 5 and a variable capacitor 6 and the other arm of which consists of a variable capacitor 7. The other end of the parallel circuit is connected to a piezoelectric crystal 8 which is, in turn, connected to the base electrode of transistor 4. The lower end of the secondary winding of transformer 3 is connected to the base electrode of transistor 4 through a variable capacitor 9.

The pass band of the selection filter in the illustrated embodiment of the invention is determined primarily by crystal 8 and capacitor 7, which combine to provide a series resonance at the frequency of the incoming radio frequency signals. The presence of capacitor 7 lowers the resonant frequency of the combination to a point several kilohertz below a harmonic of crystal 8 which is above the fundamental. Capacitor 9 is a balancing capacitor which may be adjusted to give the filter maximum rejection capability toward interference. The peak rejection may, if desired, be set close to the pass band or may, alternatively, be set farther away to obtain maximum rejection of more distant frequencies.

The oscillator mixer in the illustrated embodiment of the invention utilizes transistor 4 in a tuned-base tuned-collector configuration. As shown, the emitter electrode of transistor 4 is grounded and the collector is connected to a tank circuit made up of an inductor 10 and a variable capacity in parallel. The variable capacity may, for convenience, take the form shown of a fixed capacitor 11 and a parallel variable capacitor 12. The other side of the tank circuit is connected to the mixer output terminal 13 and to ground through the series combination of a current limiting resistor 14 and a positive D-C voltage source 15. A bypass capacitor 16 is also returned to ground from output terminal 13. Finally, a bias resistor 17 is connected from the junction between resistor 14 and voltage source 15 back to the base electrode of transistor 4. As indicated by the dashed lines, a significant parasitic capacity 18 exists between the base and collector electrodes of transistor 4 and another significant parasitic capacity 19 exists between the base electrode of transistor 4 and ground.

In the oscillator mixer shown, the positive feedback path around transistor 4 consists principally of parasitic capacity 18 as a series element, a first shunt path to ground including inductor 5, capacitor 6, and crystal 8, and a second shunt path to A-C ground including the tank circuit constituted by inductor 10 and capacitors 11 and 12. Oscillations are generated at a frequency several kilohertz below the fundamental of crystal 8, the exact frequency being determined primarily by inductor 5, capacitor 6, and crystal 8, with some minor influence from parasitic capacity 19. Inductor 5 and capacitor 6, since they are series resonant, serve to bypass capacitor 7 almost completely at the oscillation frequency. In the collector circuit of transistor 4, variable capacitor 12 is adjusted for solid oscillation and has relatively little effect on frequency.

A specific example of the illustrated embodiment of the invention for use in the 27 megahertz radio frequency range makes use of a crystal having a fundamental frequency of 9 megahertz and a third harmonic of 27 megahertz. The mixing oscillator then operates at a frequency of approximately 8.998 megahertz and the band selection filter is tuned to a frequency approximately 26.998 megahertz. The following element values are typical:

| | |
|---|---|
| Variable capacitor **2** | 3–12 micromicrofarads. |
| Inductor **5** | 5 microhenries. |
| Variable capacitor **6** | 7–45 micromicrofarads. |
| Variable capacitor **7** | 7–45 do. |
| Variable capacitor **9** | 1.5–7 do. |
| Inductor **10** | 5 microhenries. |
| Capacitor **11** | 33 micromicrofarads. |
| Variable capacitor **12** | 7–45 do. |
| Resistor **14** | 1000 ohms. |
| Voltage source **15** | 2.4 volts. |
| Capacitor **16** | 0.01 microfarad. |
| Resistor **17** | 100,000 ohms. |

Typical settings of the variable capacitors are 10 micromicrofarads for capacitor 2, 40 micromicrofarads for capacitor 6, 20 micromicrofarads for capacitor 7, 4 micromicrofarads for capacitor 9, and 35 micromicrofarads for capacitor 12.

What is claimed is:

1. A selective oscillator mixer for a superheterodyne receiver which comprises a feedback oscillator, a band selection filter connected to supply radio frequency signals to said oscillator for conversion to an intermediate frequency, a piezoelectric crystal connected in common in both the feedback path of said oscillator and said filter, and means tuning the oscillation frequency of said oscillator and the pass band of said filter substantially to different harmonics of said crystal.

2. A selective oscillator mixer for a superheterodyne receiver which comprises a feedback oscillator, a band selection filter connected to supply radio frequency signals to said oscillator for conversion to an intermediate frequency, a piezoelectric crystal connected in common in both the feedback path of said oscillator and said filter, means in said feedback path of said oscillator tuning the oscillation frequency to substantially one harmonic of said crystal, and means in said filter tuning the pass band thereof to substantially a higher harmonic of said crystal.

3. A selective oscillator mixer in accordance with claim 2 in which the crystal harmonic to which the oscillation frequency is substantially tuned is the fundamental.

4. A selective oscillator mixer in accordance with claim 2 in which the oscillation frequency of said oscillator differs from said one harmonic of said crystal in the same direction in which the selection frequency of said filter differs from said higher harmonic.

5. A selective oscillator mixer for a superheterodyne receiver which comprises a feedback oscillator and a band selection filter connected to supply radio frequency signals to said oscillator for conversion to an intermediate frequency, said oscillator comprising a transistor and a piezoelectric crystal, a first inductor, and a first capacitor connected in series in a frequency selective path between the base and emitter electrodes of said transistor, said filter comprising a frequency selective path including said crystal and a second capacitor connected in series between a radio frequency input terminal and the base electrode of said transistor, said first inductor and said first capacitor being series resonant at a frequency substantially equal to but different from one harmonic of said crystal, whereby said oscillator operates at a frequency substantially equal to but different from said one harmonic of said crystal, and said crystal and said second capacitor being series resonant at a frequency substantially equal to but different from a higher harmonic of said crystal, whereby the pass band of said filter is tuned to a frequency substantially equal to but different from said higher harmonic of said crystal.

6. A selective oscillator mixer in accordance with claim 5 in which said first inductor and said first capacitor are connected in series across said second capacitor, whereby said first inductor and said first capacitor effectively bypass said second capacitor at the operating frequency of said oscillator.

7. A selective oscillator mixer in accordance with claim 6 in which said first inductor and said first capacitor are series resonant at a frequency substantially equal to but above said one harmonic of said crystal and said crystal and said second capacitor are series resonant at a frequency substantially equal to but above said higher harmonic of said crystal.

8. A selective oscillator mixer in accordance with claim 7 in which said oscillator includes a second inductor and a third capacitor connected in parallel in a frequency selective path between the collector and emitter electrodes of said transistor, said second inductor and said third capacitor being parallel resonant at a frequency substantially equal to but below said one harmonic of said crystal.

9. A selective oscillator mixer in accordance with claim 7 in which said one harmonic of said crystal is the fundamental.

References Cited

UNITED STATES PATENTS

| | | | |
|---|---|---|---|
| 3,007,045 | 10/1961 | Paynter | 325—438 |
| 3,350,648 | 10/1967 | Berces et al. | 325—440 |

RICHARD MURRAY, Primary Examiner